Sept. 27, 1966 D. C. BAILEY 3,275,846

INTEGRATED CIRCUIT BISTABLE MULTIVIBRATOR

Filed Feb. 25, 1963

INVENTOR.
Dean C. Bailey

BY Mueller & Aichele

ATT'YS

United States Patent Office 3,275,846

Patented Sept. 27, 1966

3,275,846

INTEGRATED CIRCUIT BISTABLE MULTIVIBRATOR

Dean C. Bailey, Scottsdale, Ariz., assignor to Motorola, Inc., Chicago, Ill., a corporation of Illinois Filed Feb. 25, 1963, Ser. No. 260,402
9 Claims. (Cl. 307—88.5)

This invention relates generally to semiconductor switching circuits and particularly to an improved transistorized bistable circuit wherein a reduction of circuit components makes the circuit readily adaptable for fabrication as an integrated circuit.

There are many present day applications, especially in the computer arts, where bistable multivibrators of the type commonly known as "flip-flops" are used to provide switching, gating, counting and triggering functions. Typically such circuits are patterned after the well-known Eccles-Jordan circuit and include a pair of transistors with cross coupling networks between respective output and input electrodes to provide for multivibrator action. A widely used circuit is one which employs the transistors in the grounded emitter configuration with a coupling network connected between the output collector electrode of each transistor to the input base electrode of the other transistor. In many applications of circuits of this type it is desirable to switch the transistors between states of cutoff and saturated conduction. However, as is well known, driving a transistor to saturation gives rise to a storage phenomena of excess minority carriers which places an upper limit on the speed of operation of the flip-flop circuit. It is therefore conventional to employ speedup capacitors in the cross coupling networks between transistors so that during the switching interval reverse base current can be supplied to the transistor being cut off to overcome the effect of minority carrier storage.

In a number of applications the output voltage appearing at the collector electrode of one of the transistors, which in computer systems may conveniently represent a "one" or a "zero" in terms of binary logic, is utilized to drive a number of subsequent stages. Different loading of the collector electrode circuit by these stages will result in a change in the voltage level of the binary "one" output signal. For this reason, it is common to employ clamping circuits for the collector electrodes of the multivibrator transistors to thereby provide voltage regulation of the output signals.

For high speed operation of transistorized multivibrators for computer applications, it is further usually desirable to provide a reverse bias for the base electrodes of the transistors to insure a stable cutoff condition. In addition, since in many computer applications a single input triggering signal is provided to switch the bistable circuit, it is necessary to provide a pulse steering arrangement so that the triggering pulse will be directed to the proper transistor.

In incorporating these and other modifications in a practical flip-flop circuit for computer ssytems a large number of resistors, capacitors, and diodes are necessary to be combined with basic circuit of the two switching transistors and their cross coupling networks. In view of the present trend towards circuit standardization, miniaturization, and circuit integration, it is desirable to minimize the number of circuit components used in conjunction with the basic bistable circuit configuration. In the instance of circuit integration resistors and to some degree capacitors are more difficult to be incorporated into the integrated circuit than are semiconductor devices. In fabricating a typical integrated circuit a plurality of diffused junctions are formed on a substrate of intrinsic semiconductor material to provide a plurality of transistors and diodes as required for a specific circuit. An oxide insulating film is provided on the substrate and circuit interconnections are made by a plated circuit pattern disposed on the oxide film. Circuit resistance is provided by controlling the resistivity of selected regions of the semiconductor material or of the circuit interconnections. Capacitance is provided by reverse bias junction having a specified junction area. It is readily apparent that in an integrated circuit of this type the number of resistive and capacitive elements enhances difficulties associated with circuit fabrication techniques and that fabrication can be simplified by replacing these elements with junctions wherever possible.

It is therefore an object of the present invention to provide an improved semiconductor bistable multivibrator or flip-flop circuit which is suitable to be fabricated as an integrated circuit.

Another object of the invention is to provide a semiconductor bistable multivibrator circuit in which all capacitors and all resistors except the load resistors for the switching transistors have been replaced by semiconductor units.

A further object is to provide a semiconductor flip-flop capable of high speed switching and producing a regulated output signal without the use of a clamping circuit or speed-up capacitors.

Still another object is to provide a transistorized multivibrator circuit having an improved triggering circuit arrangement for directing the triggering pulse to the proper transistor and for insuring reliable switching of the transistors with changes in amplitude of the triggering voltage level.

A feature of the present invention is the provision of a transistor bistable multivibrator circuit wherein semiconductor junctions function as circuit equivalents for all capacitors and all the resistors except the load resistors for the switching transistors, which junctions along with the junctions forming the transistor devices may be diffused in a body of semiconductor silicon to form an integrated circuit element.

Another feature is the provision of reverse breakdown semiconductor diodes having rapid switching characteristics as cross coupling networks between stages of the transistors in a multivibrator circuit, with the reverse junction capacitance associated with the storage phenomena of such diodes providing a charge to enhance turnoff of the transistors during the switching interval, and with the diodes functioning to regulate or clamp the output voltage of the transistors.

A further feature is the provision of voltage dependent capacitance diodes coupled to the input electrodes of the switching transistors of a bistable multivibrator circuit to provide fast, reliable triggering which is less dependent on changes in the level of the triggering pulse.

Still another feature of the invention is the provision of diodes adapted to be reverse biased by the output voltage of the non-conducting transistor of a multivibrator circuit, which diodes are connected between the output electrodes of the transistors and the above-mentioned voltage dependent capacitance diodes to prevent the triggering pulse from being applied to other than the conducting transistor to effect turn off of such transistor.

Further objects, features and other attending advantages will be apparent upon consideration of the following description when taken in conjunction with the accompanying drawings, in which.

The invention provides a bistable multivibrator circuit having a pair of transistors adapted to be switched between states of non-conduction and saturation in response to a triggering pulse. Preferably each transistor is connected in the grounded emitter configuration, and a cross-coupled feedback network is provided between the output collector electrode of each transistor and the input base electrode of the other transistor. This feedback network consists of a reverse breakdown diode of the type commonly referred to as a Zener diode, having a reverse characteristic wherein a state of high conduction in a reverse direction is obtained when a voltage of a predetermined magnitude is applied across the diode. The cross-coupling diodes have a threshold voltage and a polarity such that reverse breakdown is initiated by the potential difference between the collector electrode of the non-conducting transistor and the base electrode of the conducting transistor. Accordingly, a current path is established between the collector electrode of the non-conducting transistor and the base electrode of the conducting transistor, and through the base-to-emitter junction of the conducting transistor to ground reference potential.

It is a well-known characteristic of breakdown diodes of this type that they function as a voltage regulator when in the reverse breakdown conductive state. Thus, there is a regulating action to clamp the level of the output signal appearing at the collector electrode of the non-conducting transistor to the threshold voltage of the breakdown diode so that this level does not change with loading by the output circuit. It is known that the depletion layer of a semiconducor diode spreads out when reverse biased to produce an intrinsic or effective capacitance for the diode. This reverse junction capacitance stores a charge of a predetermined magnitude when the diode is in a reverse breakdown condition, which charge is available to sweep away stored minority carriers in the conducting transistor during the switching interval. This enhances the switching speed of the transistor and speed-up capacitors are not needed in the cross-coupling network for high speed switching operation.

The triggering pulses are applied to the multivibrator by a circuit arrangement which includes voltage-dependent capacitance diodes to store a charge derived from the triggering pulses, and pulse steering diodes, adapted to be biased off by the collector voltage of the non-conducting transistor, to direct this stored charge to the base electrode of the conducting transistor. This arrangement eliminates use of the resistors and capacitors of conventional pulse steering circuits, and enables reliable triggering independent of variations of the triggering voltage level.

Figure 1:
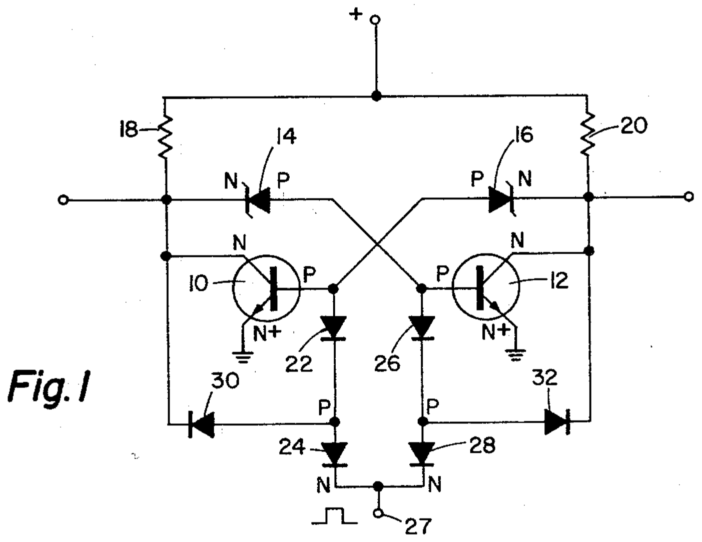
FIG. 1 is a schematic diagram of the multivibrator circuit of the present invention.

Referring now to the drawings, the bistable multivibrator of FIG. 1 includes transistors 10 and 12. For reasons hereinafter discussed the transistors are preferably of the silicon type and therefore are shown as the NPN type. Diode 14 connects the collector electrode of transistor 10 to the base electrode of transistor 12 and in a like manner diode 16 connects the collector electrode of transistor 12 to the base electrode of transistor 10. The emitter electrodes of transistors 10 and 12 are connected to ground reference potential. Operating voltage for the multivibrator is provided through load resistors 18 and 20, and is positive for the NPN devices shown. There is provided, therefore, a basic bistable multivibrator circuit with cross coupling feedback patterned after the well-known Eccles-Jordan circuit. Cross couplings diodes 14 and 16 have Zener breakdown characteristics and are selected to have a reverse junction capacitance which matches the charge stored by excess minority carriers produced when the conducting transistor is in a saturated state. The breakdown voltage level of the Zener diodes, considered in series with the emitter-to-base voltage drop of the conducting transistor, is selected so that this total voltage provides a desired regulated output level at the collector elecrode of the non-conducting transistor. Because of the inherent low leakage current associated with silicon transistors when in the non-conducting state, it is not necessary to provide a reverse base bias voltage to insure firm cutoff of the transistors.

Diodes 22 and 24 are series connected between the base electrode transistor 10 and a common input terminal 27, adapted to receive a triggering pulse. In a like manner, diodes 26 and 28 series connect the base electrode of transistor 12 to input triggering terminal 27. Diode 30 couples the junction point between diodes 22 and 24 to the collector electrode of transistor 10. Diode 32 couples the junction point of diodes 26 and 28 to the collector electrode of transistor 12. This circuit arrangement enables the desired bistable switching to be produced by triggering pulses appearing at common input terminal 27. Diodes 30 and 32 are alternately reverse biased by the voltage appearing at the collector electrodes of the non-conducting ones of transistors 10 and 12 to steer the triggering pulse through diodes 22 and 26 to the base electrode of the conducting transistor to provide turn-off of that transistor. Diodes 24 and 28 are the reverse bias capacitance type so that they store a charge provided by the triggering pulse to enhance turnoff during the triggering interval. Preferably diodes 24 and 28 are of the voltage-dependent capacitor type so that the stored charge tends to remain more constant with changes in the amplitude of the triggering voltage.

To understand operation of the circuit of FIG. 1, assume that transistor 10 is non-conducting and that transistor 12 is conducting in a state of saturation. Because of the low impedance collector-to-emitter path of transistor 12, the collector electrode and hence the output voltage level of transistor 12 is essentially at ground reference potential. With transistor 10 cutoff, a positive voltage appears at the collector electrode of transistor 10. Under these conditions diode 14 is broken down to render it conductive in the reverse direction while diode 16 remains in a non-conducting state. There is therefore a current path between the collector electrode of transistor 10 through diode 14 and the base-to-emitter junction of transistor 12 to ground reference potential. Because of the voltage regulating action of diode 14, in series with the emitter-to-base junction of transistor 12, the voltage appearing at the collector electrode of transistor 10 is independent of the current through this path. Therefore, the output voltage of transistor 10 is regulated or effectively clamped at the selected breakdown value of diode 14. Typically, for computer applications, diode 14 may be chosen to be a five volt Zener while the base-to-emitter voltage drop of silicon junction transistor 12, in saturation, is one volt. Thus, there is provided a regulated 6 volt output for transistor 10 to represent the binary "one" state, while the output of transistor 12 is maintained at ground potential to represent the binary "zero" state. When a subsequent triggering pulse is received, the respective states of conduction of transistors 10 and 12 of diodes 14 and 16 are reversed. Accordingly, the output collector electrode of transistor 10 is switched to the binary "zero" state and the output collector electrode of transistor 12 is switched to the binary "one" state, represented by a 6 volt output.

It is to be noted that when either diode 14 or diode 16 is in a conducting state, a charge is stored which is proportional to its reverse junction capacitance. From the fundamental relationship of $Q=CV$, where Q is the value of stored charge, C the effective value of reverse junction capacitance, and V the voltage developed across the diode, it can be seen that this stored charge can be made of a predetermined value by selection of the capacitance and the breakdown voltage of diodes 14 and 16. When this product is selected to match the charge resulting from stored minority carriers in the emitter-base junction of the saturated conducting transistor, the charge of either diode 14 or 16 is available to sweep away these minority carriers during the switching interval. This provides rapid switching between states of conduction for transistors 10 and 12, and it is not necessary to provide speed-up capacitors across diodes 14 and 16 for high frequency operation as is the case in conventional multivibrator circuits. By proper matching of the Zener diode with the emitter-base junction of the transistors, it is possible to use switching-type Zener diodes so that the speed of multivibrator operation is not impaired by the storage effect of the diodes themselves.

Triggering of the NPN transistors shown is readily accomplished by application of a positive going pulse with a width capable of charging diodes 24 or 28 to the common cathode electrodes of diodes 24 and 28 at terminal 27. With transistor 10 in its non-conducting state, the voltage appearing at its collector electrode provides a reverse bias to the cathode diode 30 to prevent this diode from becoming conductive. Diode 32, on the other hand, is connected to ground reference potential appearing at the collector electrode of transistor 12. Thus a positive going triggering pulse is prevented from charging diode 24, but is allowed to charge diode 28 through diode 32 to ground reference potential. As previously mentioned, diodes 24 and 28 are reverse-bias capacitance diodes and accordingly receive a charge when a charging current path is provided for the triggering pulse. This charge is coupled through either diode 22 or 26 to the base electrode of the conducting transistor to provide turn-off. For the circuit shown triggering is initiated by the trailing edge of a positive going triggering pulse. Because of the multivibrator action, transistor 10 is concurrently turned on. At the same time the relative states of conduction of Zener diodes 14 and 16 are changed. These diodes, selected for their rapid switching operation, also provide a stored charge which enhances turn-off of the saturated transistor, resulting in high speed multivibrator action.

In the operation of the steering gate, it is believed that the positive triggering pulse charges diode 28 as the current flows to ground through diodes 28, 32 and transistor 12. This charge creates a reverse bias across diode 28. Diode 32 is conducting and has a forward voltage drop. Diode 26 is almost conducting but is neutral with no current flow. The voltage of the junction point of diodes 26, 28 and 32 is positive by the sum of the forward voltage drop of diode 32 plus the saturated voltage of transistor 12. As the trailing edge of the triggering pulse comes down, diode 28 starts to discharge, diode 26 starts on, pulling down the base voltage of transistor 12. Transistor 12 starts turning off, the junction point of transistor 12, Zener diode 16 and resistor 20 starts rising, and diode 32 becomes reverse biased. (The next triggering pulse will be steered to transistor 10.) As the base voltage of transistor 12 falls, Zener diode 14 becomes less reverse biased to a point that it reverts to normal reverse biased diode behavior (no current flow). Meanwhile, Zener diode 16 is snapped on by the rise to Zener voltage, turning on transistor 10 and completing the half cycle.

Diodes 24 and 28 are preferably of the type which have a voltage-dependent reverse junction capacitance. There is an inverse relationship between the voltage developed across diodes 24 and 28 by the triggering pulse and the capacitance associated therewith so that if the level of the triggering pulse changes, the total charge stored by the diodes remains substantially constant. Thus, stable triggering is provided, independent of the level of the triggering pulse supplied to the multivibrator.

It is readily apparent that the described multivibrator does not require the use of conventional capacitors as circuit elements. In addition, all resistors have been eliminated except load resistors 18 and 20. Although this circuit can conveniently be constructed in the usual manner by using separate circuit elements, it is particularly advantageous to incorporate elements of the circuit of FIG. 1 in a single body of semiconductor substrate to form what is known as an integrated circuit. In such circuits N-type and P-type regions are formed in the semiconductor body by a diffusion process in the well known manner. Proper masking of the body limits the diffused regions to a desired area, and by forming diffused junctions and ohmic contacts on the substrate, a plurality of transistors and diodes of selective types may be formed. During the diffusion process provision of an oxidizing atmosphere causes the surface of the semiconductor body to oxidize to form a thin insulating layer in the order of a few microns thick to provide good electrical insulation between the various semiconductor devices formed in the substrate. Portions of the oxide layer are removed by a chemical etching process to allow ohmic contact with selected regions in the substrate. It is then possible, by standard plated circuit techniques, to provide the necessary interconnections by conductors deposited over the insulating layer.

Figure 2:
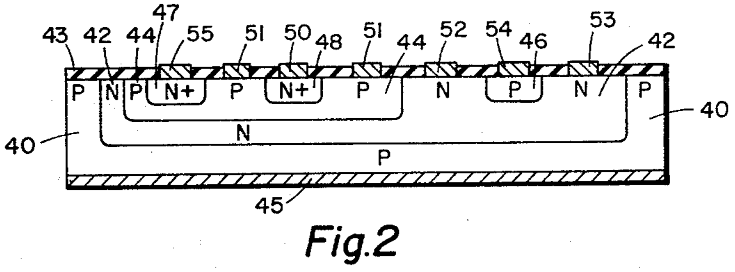
FIG. 2 is a cross-section of a typical integrated circuit structure illustrating the manner in which the circuit of FIG. 1 may be fabricated.

The cross section of a typical integrated circuit constructed in the above described manner is shown in FIG. 2. This cross section is taken to encompass transistor 10, Zener diode 16, and diode 30. The circuit includes a body or substrate 40 of P-type silicon semiconductor material. The semiconductor body further includes a relatively large region of N-type semiconductor material 42, additional smaller P-type regions 44 and 46, and N+ regions 47 and 48. These regions are formed by conventional masked diffusion processes to form diffused junction zones between adjacent regions in the substrate body. An insulating film 43 is provided on the top of the semiconductor body, and a metallic bottom plate 45 is provided to serve as a ground plane for the electrical circuit.

Transistor 10 is completed by providing emitter electrode 50 in ohmic contact with region 48, base electrode 51 in ohmic contact with zone 44, and a collector electrode 52 forming an ohmic contact with zone 42. According to conventional practice, contact electrodes 50, 51 and 52 may be circular or rectilinear, with the emitter contact generally surrounded by relatively larger area base and collector contacts.

Accordingly, regions 42, 44 and 48 form an NPN silicon diffused junction transistor. Electrical contact 53, contiguous with collector region 42, receives the collector operating voltage. The relatively high resistivity of N-type region 42 between electrical contacts 52 and 53 provides load resistance 18. Alternately the load resistance may be provided by surface interconnection having the proper resistivity.

Conductor 54, in electrical contact with P-type region 46, provides the anode electrode for diode 30. It is to be noted that in FIG. 1 the collector electrode of transistor 10 and the cathode electrode of diode 30 are electrically common. Therefore, the PN junction between regions 42 and 46 provides the junction of diode 30, with the cathode electrode being contiguous with the collector electrode of transistor 10. A plated circuit pattern (not shown) disposed on insulating layer 43, interconnects the anode of diode 30 with the common point of diodes 22 and 24. Electrical conductor 55 in ohmic contact with region 47, provides the cathode electrode for Zener diode 16. A plated circuit pattern (not shown) disposed over insulating layer 43 interconnects the collector electrode of transistor 12 with the anode electrode of diode 16. The junction for diode 16 is provided by regions 44 and 47, with P-type region 44 being contiguous with the base region of transistor 10 to form an electrically common point between the anode electrode of diode 16 and the base electrode of transistor 10 as shown in FIG. 1. It is to be understood that a similar arrangement on body 40 provides for transistor 12, Zener diode 14, and diode 32.

Figure 3:
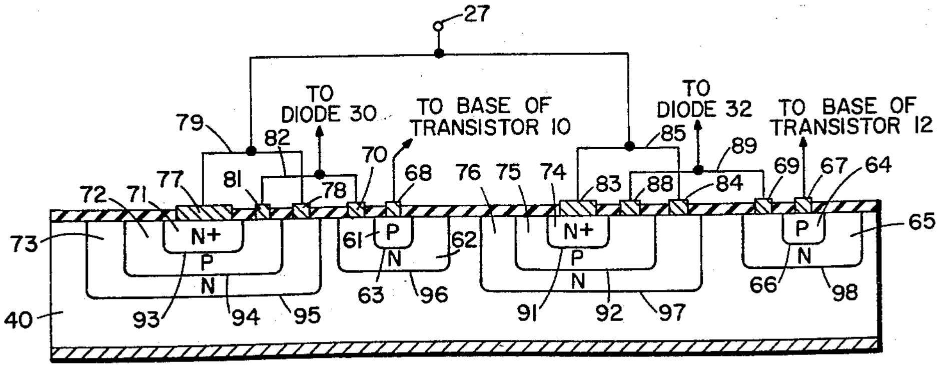
FIG. 3 is another cross-section of the integrated circuit of FIG. 2.

FIG. 3 is another cross section of the typical integrated circuit forming the multivibrator circuit of FIG. 1 to illustrate the manner in which diodes 22, 24, 26 and 28 may be provided in semiconductor body 40. Certain interconnections are shown in FIG. 3 to facilitate the description. The diode 22 is formed by P-type region 61 and N-type region 62 with the PN junction 63 between them. Similarly, diode 26 is formed by P-type region 64 and N-type region 65 which form a junction 66 between them. Conductors 67 and 68 in ohmic contact with the P-type regions 61 and 64 are the anode contacts for these diodes, and conductors 69 and 70 are their cathode contacts.

In the integrated structure of FIG. 3, the diode 24 is formed by regions 71, 72 and 73, and the diode 28 is formed by regions 74, 75 and 76. Regions 71–73 and 74–76 are actually transistors with their emitter and collector portions shorted together so that each such transistor is equivalent to two diodes connected in parallel. The N+ type emitter region 71 is shorted to the N-type collector region 73 through the ohmic contacts 77 and 78 and the interconnection 79. The P-type base region 72 is connected through the ohmic contact 81 and the interconnection 82 to the cathode contact 70 for diode 22. The regions 74, 75 and 76 are interconnected in the same manner to provide capacitance equivalent to that of the diode 28. The emitter region 74 is shorted to the collector region 76 through contacts 83, 84 and the interconnection 85. The base region 75 is connected through contact 88 and interconnection 89 to the cathode contact 69 for the diode 26.

When a positive triggering pulse is applied at terminal 27, it is supplied to the emitter regions 71 and 74 and also to the collector regions 73 and 76. If the transistor 10 is non-conducting and the transistor 12 is conducting, the emitter-base junction 91 and the collector-base junction 92 will both be reverse-biased and will receive a charge since the diode 32 will be conductive and provide a charging current path for the triggering pulse. The capacitances of junctions 91 and 92 are in parallel with each other, and their charge will be coupled through diode 26 to the base electrode of transistor 12 to turn that transistor off. The next triggering pulse will bias junctions 93 and 94 in the reverse direction, and their stored charge will be coupled through diode 22 to the base electrode of transistor 10 in the same manner.

The junctions 95, 96, 97 and 98 introduce parasitic capacitances to ground, and it is desirable to make these capacitances as small as possible to reduce their undesired effect. For the diodes 22 and 26, this is accomplished by making the area of junctions 96 and 98 relatively small. For the diodes 24 and 28, the junctions 93 and 91 are made relatively large so as to make the capacitance of the paralleled emitter-base and collector-base junctions relatively large. The junctions 95 and 97 are made as small as possible consistent with the objective of increasing the capacitance of the paralleled junctions. The doping of the regions 71–73 and of regions 74–76 becomes lighter with increasing depth in the semiconductor body 40, and this increases the capacitance value per unit area of the junctions 91, 92, 93 and 94 relative to the junctions 95 and 97 so as to maintain the highest possible ratio of series to shunt capacitance.

It has been found that a circuit constructed in accordance with this invention provides excellent results for switching speeds in the order of 300 kilocycles. By further providing relatively high resistance shunts across diodes 30 and 32 and across diodes 22 and 26 it is possible to provide stable operation at 10 megacycles. These shunts may be resistors in the order of 10,000 ohms and can be conveniently provided by built in surface shunts in the deposited interconnection pattern of the intergrated circuit of the type shown in FIGS. 2 and 3. For high temperature operation Zener diodes 14 and 16 may also be provided with built-in surface shunts.

The invention provides therefore a novel biastable multivibrator circuit of the type commonly used as a flip-flop in computing systems. The switching transistors in the multivibrator are NPN silicon transistors which may be conveniently diffused into a silicon semiconductor body.

All capacitors in the circuit have been replaced by semiconductor devices, as have all resistors except the load resistors for the multivibrator. It is therefore possible to diffuse the entire circuit into the same semiconductor body containing the switching transistors to thereby provide an integrated circuit. The output level of the voltage appearing at the collector electrodes of the multivibrator transistors are regulated by Zener or reverse breakdown diodes utilized in the cross-coupling network. In addition, the reverse junction capacitance of these diodes provides a stored charged to enhance switching speeds so that speed-up capacitors are not needed in a cross-coupling network. An all diode pulse steering triggering circuit arrangement is provided so that the multivibrator may be triggered at a common input point. Voltage-dependent capacitance diodes are utilized to store a charge provided by the triggering pulse to further enhance triggering speed and to provide stable triggering with changes in the amplitude of the triggering voltage.

I claim:

1. A bistable multivibrator circuit including first and second transistors each having collector, emitter and base electrodes, means for connecting the collector electrode of each said transistor to a potential source, means for connecting the emitter electrode of each said transistor to a common reference potential, semiconductor diode means poled for reverse conduction connecting the collector electrode of each said transistor to the base electrode of the other said transistor, said diode means having a reverse breakdown voltage characteristic less than the voltage appearing at the collector electrode of the non-conducting one of said transistors, and with said diode means having a value of reverse junction capacitance to store a charge at least equal to the charge stored by excess minority carriers in the base of the conducting transistor, and circuit means for coupling triggering pulses to the base electrode of said transistors to thereby provide alternate states of conduction and non-conduction, said last named circuit means including first and second pairs of semiconductor diodes series connected between the base electrode of each said transistor and a common trigger input terminal, and a semiconductor diode coupling the junction point of the series diodes in each said pair to the collector electrode of each said transistors whereby when one of the coupling diodes is conducting and the other is reverse biased, the triggering pulse will charge the series diode associated with the conducting diode.

2. A bistable multivibrator circuit in accordance with claim 1 wherein said transistors and said diodes are comprised of a plurality of P-type and N-type regions having junctions therebetween diffused in a single body of semiconductor material, with a patterned circuit conductor disposed on one major surface thereof to provide for circuit interconnections.

3. A bistable multivibrator circuit including first and second transistors each having collector, emitter and base regions, means for connecting the collector region of each said transistor to a source of potential, means for connecting the emitter region of each said transistor to a common reference potential, first and second semi-conductor diodes coupling the collector region of each said transistor to the base region of the other transistor, said first and second diodes having reverse avalanche breakdown voltage characteristic less than the voltage appearing at the collector region of the non-conducting one of said transistors and poled to conduct in the reverse direction to provide a current path between such transistor and the base region of the conducting transistor, with said first and second diodes having a value of reverse junction capacitance to store a charge matching the excess minority carriers stored in the base region of the conducting transistor, circuit means including third and fourth semiconductor diodes connecting the base electrode of each said transistor to a common trigger input terminal, and fifth and sixth semiconductor diodes adapted to be biased to non-conduction by the voltage appearing at the collector region of the non-conducting one of said transistors coupled between said collector regions and individual ones of said third and fourth diodes, whereby triggering pulses applied to said triggering input terminal are directed to the base electrode of the conducting one of said transistors to produce alternate states of conduction and non-conduction whereby when one of the coupling diodes is conducting and the other is reverse biased, the triggering pulse will charge the series diode associated with the conducting diode.

4. A bistable multivibrator circuit in accordance with claim 3 wherein said transistors and said diodes are of the junction type, with said junctions diffused in a single substrate body of silicon semiconducting material.

5. A saturating trigger circuit in accordance with claim 3 wherein said transistors and said diodes are of the junction type, with said junctions diffused in a single substrate body of silicon semiconducting material.

6. A saturating trigger circuit including in combination, first and second transistors each having collector, emitter and base regions, means for connecting the collector region of each said transistor to a potential source, means for connecting the emitter region of each said transistor to a common reference potential, semiconductor diodes coupling the collector region of each said transistor to the base region of the other transistor, said diodes characterized by a low resistance in the reverse direction for voltages of a given polarity and exceeding a predetermined magnitude, and said diodes further having a reverse junction capacitance which for a given level of breakdown voltage stores a charge matching the excess minority carriers stored in the base region of the conducting one of said transistors, and circuit means for coupling triggering pulses to the base region of said transistors to provide alternate states of saturation and non-conduction, with last said circuit means including a first pair of semiconductor diodes having a reverse junction poled to store a charge upon receipt of a triggering pulse and a second pair of semiconductor diodes adapted to be biased to non-conduction to thereby direct the charge stored by said first pair of diodes to the base region of the conducting one of said transistors to provide turn-off of such transistor.

7. A saturating trigger circuit in accordance with claim 6 wherein the diodes of said first pair have a reverse junction capacitance which varies inversely with the level of the triggering voltage applied thereto.

8. A bistable multivibrator in accordance with claim 6 wherein said transistors and said diodes are comprised of a plurality of P-type and N-type regions having junctions therebetween diffused in a single body of semiconductor material, with patterned circuit conductors disposed on one major surface thereof to provide for circuit interconnections.

9. A saturating trigger circuit in accordance with claim 6 wherein said transistors and said diodes are comprised of a plurality of P-type and N-type regions having junctions therebetween diffused in a single body of semiconductor material, with a patterned circuit conductor disposed on one major surface thereof to provide for circuit interconnections, and with each of the diodes of said first pair comprising diffused junction transistor means having emitter and collector regions shorted together to thereby provide two diode junctions connected in parallel.

References Cited by the Examiner

UNITED STATES PATENTS

| | | | |
|---|---|---|---|
| 2,939,969 | 6/1960 | Kwap et al. | 307—88.5 |
| 3,098,158 | 7/1963 | Wanlass | 307—88.5 |
| 3,110,870 | 11/1963 | Ziffer | 331—113 |
| 3,129,354 | 4/1964 | Hellstrom | 315—27 |

JOHN W. HUCKERT, *Primary Examiner.*

D. J. GALVIN, *Examiner.*

R. F. SANDLER, *Assistant Examiner.*